United States Patent [19]

Ogitani et al.

[11] Patent Number: 5,095,047
[45] Date of Patent: Mar. 10, 1992

[54] EPOXY RESIN COMPOSITION AND MULTILAYER PRINTED WIRING BOARD HAVING INSULATING LAYER FORMED THEREFROM

[75] Inventors: Osamu Ogitani, Koshigaya; Ryuichi Fujii, Urawa; Toru Shirose, Koshigaya, all of Japan

[73] Assignee: Somar Corporation, Japan

[21] Appl. No.: 502,939

[22] Filed: Apr. 2, 1990

[30] Foreign Application Priority Data

Apr. 24, 1989 [JP] Japan .................. 1-104206

[51] Int. Cl.$^5$ .............................. C08K 7/00
[52] U.S. Cl. .................. 523/220; 523/440; 523/443; 523/446
[58] Field of Search ............. 523/440, 443, 446, 220

[56] References Cited

FOREIGN PATENT DOCUMENTS 61-215615 9/1986 Japan .................. 523/466
63-297420 12/1988 Japan .................. 523/466

Primary Examiner—Paul R. Michl
Assistant Examiner—U. K. Rajguru
Attorney, Agent, or Firm—Lorusso & Loud

[57] ABSTRACT

A thermosetting resin composition suitable for forming an insulating layer to be interposed between two adjacent wiring patterns of a multilayer printed wiring board is disclosed which includes a bisphenol AD epoxy resin, an aromatic polyamine, mica having an average particle size of 50 μm or less, and silica having an average particle size of 20 μm or less, the average particle size of the silica being smaller than that of the mica, and the amount of the silica being 20-80% based on the total weight of the silica and the mica.

5 Claims, 1 Drawing Sheet

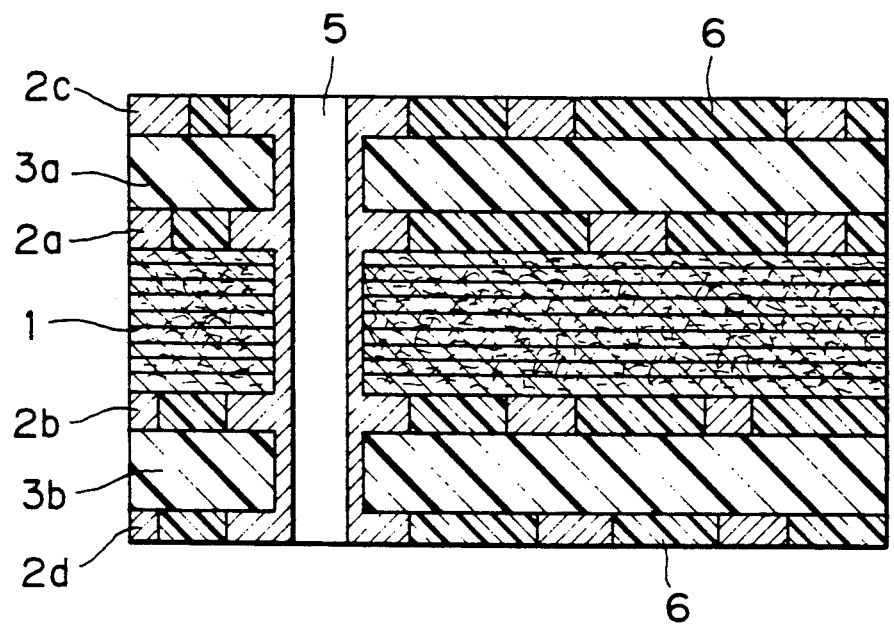

EPOXY RESIN COMPOSITION AND MULTILAYER PRINTED WIRING BOARD HAVING INSULATING LAYER FORMED THEREFROM

This invention relates to a thermosetting resin composition useful for forming an insulating layer to be interposed between two adjacent wiring patterns of a multilayer printed wiring board. The present invention is also concerned with a multilayer printed wiring board having an insulating layer formed from the above thermosetting resin composition.

One well known method for preparing multilayer printed wiring boards is a so-called build-up method in which a resin coating liquid is applied over a surface of a first wiring pattern of a printed wiring board to form an insulating layer, and a second wiring pattern is thereafter formed by electroless plating over the insulating layer.

One problem associated with the build-up method is that the formation of the insulating layer tends to cause warp of the resulting printed wiring board. The warp of the board causes difficulties in forming a plating-resist layer with a uniform thickness thereon by screen printing which is performed prior to the chemical plating. Thus, it is important that the resin coating liquid for the formation of the insulating layer should not cause shrinkage during its curing stage in order to prevent warp of the board. Warp of the board also causes a difficulty in the formation of another insulating layer of a uniform thickness by a screen printing method or a roll coating method, when a further wiring pattern is intended to be provided.

The insulating layer of multilayer printed wiring boards should also exhibit a high grass transition point Tg, high resistance to voltage, heat and chemicals and good electrically insulating properties. A high glass transition point of at least 100 °C. is desired for the prevention of occurrence of smears in a drilling operation for the formation of through-holes in the printed wiring board. The chemical resistance is required in the electroless plating stage for the fabrication of the multilayer printed wiring boards while the heat resistance is required in soldering stage of the boards for mounting electric parts thereon. The term "resistance to voltage impression" used in the present specification is intended to refer to interlayer electrical insulating property.

The present inventors previously proposed a thermosetting resin composition including an aromatic epoxy resin having at least two epoxy groups, an aromatic polyamine and mica (Japanese Published Unexamined Patent Application (Tokkyo Kokai) No. 63-297,420). This composition, however, has been found not to be fully satisfactory with respect to the resistance to voltage properties. In particular, it has been found that even when the thermosetting resin composition is used to form an insulating layer interposed between two wiring patterns of a multilayer printed wiring board, short circuit between the two wiring patterns sometimes occurs. According to the investigation by the present inventors, such short circuit is considered to result from defects, such as a pin hole, of the insulating layer. The previously proposed thermosetting resin composition is also not satisfactory with respect to glass transition point of a hardened mass obtained therefrom.

It is, therefore, the prime object of the present invention to provide a thermosetting resin composition which does not cause warp of a board and which affords an insulating layer having a high glass transition point, excellent resistance to voltage impression, heat and chemicals and good electrically insulating property.

In accordance with one aspect of the present invention there is provided a thermosetting resin composition comprising:
  a bisphenol AD epoxy resin;
  an aromatic polyamine;
  mica having an average particle size of 50 μm or less; and
  silica having an average particle size of 20 μm or less, the average particle size of the silica being smaller than that of the mica, and the amount of the silica being 20-80 % based on the total weight of the silica and the mica.

In another aspect the present invention provides a multilayered printed wiring board comprising a wiring board having a first wiring pattern on a surface thereof, an insulating layer provided to cover the first wiring pattern, and a second wiring pattern provided on a surface of the insulating layer, said insulating layer being formed of a cured product of the above thermosetting resin composition.

The present invention will now be described in detail below with reference to the accompanying drawing in which the sole FIGURE is a partial, cross-sectional view diagrammatically showing an example of a multilayer printed wiring board embodying the present invention.

The bisphenol AD epoxy resin is diglycidyl ether of bisphenol AD obtained by reaction of bisphenol AD with epichlorohydrin in the presence of an alkali:

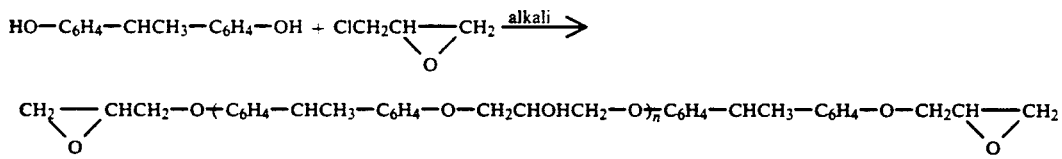

(n is an integer of 0 or more)

Bisphenol AD epoxy resins having a weight epoxy equivalent of 163-291 are preferably used. Bisphenol AD epoxy resins are commercially available as, for example, R710 manufactured by Mitsui Petroleum Chemical Industries, Inc.

The aromatic polyamine serves to function as a curing agent for the above epoxy resin and may be, for example, an aromatic diamine such as methaphenylenediamine, diaminodiphenylmethane, diaminodiphenylsulfone or a eutectic mixture thereof. Epicure Z (manufactured by Yuka-Shell Epoxy Inc.) and Kayahard A-A (manufactured by Nihon Kayaku K. K.) are suitable examples of such diamines. The aromatic polyamine is preferably used in an amount so that the ratio of equivalents of the active hydrogen of the polyamine to equivalents of the epoxy group of the bisphenol AD epoxy resin is in the range of 0.7-1.3, more preferably 0.85-1.15, for reasons of good bonding force of the thermosetting resin composition after curing.

Both hard mica and soft mica may be used for the purpose of the present invention. The mica has an average particle size of 50 μm or less, preferably 1-40 μm. Illustrative of suitable mica are hard mica C-3000 (manufactured by Shiraishi Kogyo K. K.) and soft mica S-325B (manufactured by Repco Inc.).

Silica to be used in conjunction with the above mica may be fused silica, amorphous silica or surface-treated silica. Surface treated silica may be, for example, silica particles surface-treated with a silane coupling agent, a titanate or a silicone resin. The average particle size of the silica should smaller than that of the mica and is 20 μm or less, preferably 0.1-10 μm. Illustrative of suitable silica are IMSIL A-108 or IMSIL A-10 (manufactured by Tatsumori Inc.).

The amount of the silica in the composition according to the present invention should be 20-80 % based on the total weight of the silica and the mica. An amount of the silica below 20 % by weight cannot provide satisfactory resistance to voltage impression. When the amount of the silica exceeds 80 % by weight, on the other hand, warp of the board is apt to be caused. The amount of silica is preferably 25-75 % based on the total weight of the silica and the mica.

The reason why the use of mica in conjunction with silica can improve resistance to voltage is unknown. Presumably, the presence of silica facilitates orientation of scale-form mica in parallel to the insulating layer so that the insulating layer can withstand an electrical voltage impressed in the direction normal thereto.

The total weight of the mica and the silica in the thermosetting resin composition of the present invention is preferably 5-80 %, more preferably 10-75 % based on the total weight of the bisphenol AD epoxy resin and the aromatic polyamine. Too small an amount of the mica and silica causes warp of the board while too large an amount thereof tends to cause difficulty in coating of the resin composition.

The thermosetting resin composition may further contain a variety of other components such as a viscosity controlling agent, a flame retardant, an auxiliary flame retardant, a curing promoter, a leveling agent, a dye, a pigment and antifoaming agent. As a viscosity controlling agent, there may be used a reactive diluent containing an epoxy group, such as butyl glycidyl ether, phenyl glycidyl ether, 1,6-hexanediol diglycidyl ether, trimethylolpropane triglycidyl ether or a brominated phenyl glycidyl ether having a bromine content of 40-50 % by weight. The last mentioned brominated compound also serves to function as a flame retardant.

In use, the above thermosetting resin composition is applied on a surface of a printed pattern of a wiring board by a suitable coating method such as flow coating, roll coating or screen printing, followed by curing to form an insulating layer over the printed pattern. The curing may be performed at a temperature of 100°-200° C. for 30-300 minutes. The insulating layer generally has a thickness of 20-500 μm, preferably 50-400 μm. Another pattern is then formed on the insulating layer by electroless plating in the conventional manner, thereby to obtain a multilayer printed wiring board.

An example of such a multilayer printed wiring board is shown in the accompanying drawing. Designated as 1 is a board having two wiring patterns 2a and 2b on both sides thereof. Provided over the wiring patterns 2a and 2b are insulating layers 3a and 3b, respectively, obtained by coating and curing the thermosetting resin composition according to the present invention. Two outermost wiring patterns 2c and 2d are formed on the insulating layers 3a and 3b by electroless plating. Designated as 5 is a through hole for insertion of a lead wire of an electrical part and as 6 is a plating resist.

The following examples will further illustrate the present invention.

EXAMPLE 1

First and second agents having the compositions shown in Table 1 were prepared. 100 Parts by weight of the first agent were then mixed with the second agent in an amount shown in Table 1 to form a thermosetting resin composition (coating liquid). The composition was tested, after hardening, for glass transition temperature Tg, resistance to voltage, warp, electrical insulating property and resistance to heat. In the tests, the curing of the composition was performed in a two stage manner at 120° C. for 60 minutes and, then, at 170° C. for 60 minutes. The test results are shown in Table 1.

COMPARATIVE EXAMPLES 1-3

Example 1 was repeated in the same manner as described using the components shown in Table 1. The test results are shown in Table 1

The components shown in Table 1 are as given below:

R-710: Bisphenol AD epoxy resin, weight epoxy equivalent: 169-179, manufactured by Mitsui Petroleum Chemical Industries, Inc.

Epikote 828: Bisphenol A epoxy resin, epoxy equivalent: 184-194, manufactured by Yuka-Shell Epoxy Inc.

Mica C-3000: Average particle size: 7 μm, manufactured by Shiraishi Kogyo Inc.

Silica A-108: Silica IMSIL A-108, average particle size: 1.22 μm, manufactured by Tatsumori Inc.

Diluent: 1,6-Hexanediol diglycidyl ether

BROC: Brominated phenyl glycidyl ether, manufactured by Nihon Kayaku K. K.

Auxiliary flame retardant: $Sb_2O_3$

Curing agent: 4,4'-diamino-3,3'-diethyldiphenylmethane, KAYAHARD A-A, manufactured by Nihon Kayaku K. K.

The test methods are as follows:

Glass transition temperature (Tg):

The composition is cured to form a hardened mass with a thickness of 3 mm. Tg is measured in accordance with the TMA method. Tg of at least 100° C. is desired.

Warp test:

The composition is applied over a copper layer of a copper clad, glass cloth-epoxy resin board having a size of 500×200×0.8 mm by screen printing and cured to obtain a resin layer having a thickness of 170-190 μm. The resulting laminate bearing the cured layer is then placed on a flat table at room temperature. The maximum gap between the table surface and the underside surface of the board is measured. A gap smaller than 15 mm is desirable.

Electrical insulation test:

The composition is applied to a surface of IPC comb-type electrode and cured to form a resin layer having a thickness of 170-190 μm. Electrical resistivity is measured at a voltage of 500 V.

Heat resistance test:

The composition is applied and cured in the same manner as in the above Warp Test. The cured layer is immersed in a solder bath at 260° C. for 10 seconds. Heat resistance is evaluated as follows:

Good: no changes are observed

Poor: a change such as blister is observed

Resistance to voltage impression test:

The composition is applied and cured in the same manner as in the above Warp Test. On the resulting cured layer is placed an electrode having a diameter of 10 mm and a direct current voltage (100 V) is impressed between the copper layer and the electrode to determine whether or not current is transmitted therebetween. Similar measurement is repeapted at 500 different positions of the cured layer. Voltage resistance is evaluated as follows:

Good: No current transmission is observed in any of the 500 measurements

Poor: Current transmission is observed in one or more of the 500 measurements

TABLE 1

|  | Example | Comparative Example | | |
|---|---|---|---|---|
|  |  | 1 | 2 | 3 |
| First Agent (parts by weight) |  |  |  |  |
| R-710 | 80 | — | 80 | 80 |
| Epikote 828 | — | 60 | — | — |
| Mica C-3000 | 40 | 55 | 55 | — |
| Silica A-108 | 15 | — | — | 55 |
| Diluent | 10 | 30 | 10 | 10 |
| BROC | 10 | 10 | 10 | 10 |
| Auxiliary flame retardant | 1 | 1 | 1 | 1 |

TABLE 1-continued

|  | Example | Comparative Example | | |
|---|---|---|---|---|
|  |  | 1 | 2 | 3 |
| Second Agent (parts by weight) |  |  |  |  |
| Curing agent | 24 | 22 | 24 | 24 |
| Properties |  |  |  |  |
| Tg (°C.) | 110 | 70 | 110 | 110 |
| Warp (mm) | 13 | 10 | 22 | 20 |
| Insulation ($\times 10^{14} \Omega$) | 3.0 | 2.0 | 3.3 | 3.2 |
| Heat resistance | good | good | good | good |
| Voltage resistance | good | poor | poor | good |

What is claimed is:

1. A thermosetting resin composition comprising:
a bisphenol AD epoxy resin;
an aromatic polyamine;
mica having an average particle size of 50 μm or less; and
silica having an average particle size of 20 μm or less, the average particle size of the silica being smaller than that of the mica, and the amount of the silica being 20-80 % based on the total weight of the silica and the mica.

2. A composition according to claim 1, wherein the mica has an average particle size of 1-40 μm.

3. A composition according to claim 1, wherein the silica has an average particle size of 0.1-10 μm.

4. A composition according to claim 1, wherein the amount of the silica is 25-75 % based on the total weight of the silica and the mica.

5. A composition according to claim 1, wherein the total weight of the mica and the silica is 5-80 % based on the total weight of the bisphenol AD epoxy resin and the aromatic polyamine.

* * * * *